United States Patent [19]
Ho et al.

[11] Patent Number: 5,932,115
[45] Date of Patent: Aug. 3, 1999

[54] METHOD OF MANUFACTURING A CROWN SHAPE CAPACITOR

[75] Inventors: Yu-Chun Ho, Taipeihsien; Meng-Chao Cheng, Hsin-Chu Hsien; Pei-Wen Li, Kaohsiung; Hsu-Li Cheng, Tainanhsien; Yu-Hua Huang, Taipeihsien; Shing-Huang Wu, Taichunghsien, all of Taiwan

[73] Assignee: Vanguard International Semiconductor Corporation, Hsinchu, Taiwan

[21] Appl. No.: 08/642,515

[22] Filed: May 3, 1996

[51] Int. Cl.⁶ .............................. H01L 21/70; H01L 27/00
[52] U.S. Cl. .............................. 216/67; 216/72; 438/243; 438/386; 438/706
[58] Field of Search .................................... 438/243, 386, 438/706; 216/67, 72

[56] References Cited

U.S. PATENT DOCUMENTS 4,225,945  9/1980  Kuo .......................................... 365/149
5,374,580  12/1994  Baglee ...................................... 437/52

OTHER PUBLICATIONS

CAPLUS 1996:637535, 1996.
WPIDS 96–159702, 1996.
WPIDS 97–384188, 1997.
WPIDS 97–434399, 1997.
INSPEC 94:4712575, 1994.

*Primary Examiner*—D. Margaret M. Mach
*Attorney, Agent, or Firm*—Christensen O'Connor Johnson & Kindness PLLC

[57] ABSTRACT

The present invention is a method of manufacturing crown shape capacitors for use in DRAM semiconductor memory. The method includes the steps of forming a first polysilicon layer, patterning a photoresist on the first polysilicon layer, etching the first polysilicon layer, using oxygen plasma to strip the photoresist, forming a side wall polymer onto the side walls of the first polysilicon layer, using the side wall polymer as a mask to etch back the first polysilicon layer to form a crown shape structure, removing the side wall polymer, depositing a dielectric layer onto the first polysilicon layer, and depositing a second polysilicon layer onto the dielectric layer.

9 Claims, 4 Drawing Sheets

METHOD OF MANUFACTURING A CROWN SHAPE CAPACITOR

BACKGROUND OF THE INVENTION

1. Field of the Invention
2. Description of the Prior Art

Great progress has been made in the manufacture of Dynamic Random Access Memory (DRAM) using high density integrated circuit technology. The industry has progressed from DRAMs of 16 Kbits capacity to DRAMs of up to 64 Mbits capacity.

A memory cell for each bit in semiconductor DRAM typically consists of a storage capacitor and an access transistor. Either the source or drain of the transistor is connected to one terminal of the capacitor. The other side of the transistor and the transistor gate electrode are connected to external connection lines called a bit line and a word line, respectively. The other terminal of the capacitor is connected to a reference voltage. Thus, the formation of a DRAM memory cell comprises the formation of a transistor, a capacitor and contacts to external circuits. The capacitor type that is most typically used in DRAM memory cells are planar capacitors, which are relatively simple to manufacture.

However, in order to achieve high performance (i.e. high density), memory cells in DRAM technology must be scaled down to the submicrometer range. Thus, as the capacity of DRAMs has increased, the size of the memory cells must steadily decrease. For very small memory cells, planar capacitors become very difficult to use reliably. Specifically, as the size of the capacitor decreases, then the capacitance of the capacitor also decreases. Similarly, the size of the charge capable of being stored by the capacitor decreases. This results in the capacitor being very susceptible to a particle interference. Additionally, as the capacitance decreases, the charge held by storge capacitor must be refreshed often.

Prior art approaches to overcoming these problems have resulted in the development of the trench capacitor (see U.S. Pat. No. 5,374,580) and the stacked capacitor. The trench capacitor has the well-known problem of "gated diode leakage," which is the leakage of current resulting in the trench capacitor failing to hold a charge. The stacked capacitor suffers from the problem of high manufacturing complexity.

Another way to increase the capacitance per unit area is to etch a groove in the capacitor terminal, thus increasing the area of the capacitor. See, for example, U.S. Pat. No. 4,225,945 and U.S. Pat. No. 5,374,580. Reducing the thickness of the dielectric also can improve the capacitance of the capacitor, but this approach is limited because of yield and reliability problems.

The present invention provides a DRAM capacitor which provides high storage capacitance per unit of semiconductor surface.

SUMMARY OF THE INVENTION

A method of manufacturing crown shape capacitors for use in DRAM semiconductor memory is disclosed. The method includes the steps of forming a first polysilicon layer, patterning a photoresist on the first polysilicon layer, etching the first polysilicon layer, using oxygen plasma to strip the photoresist, forming a side wall polymer onto the side walls of the first polysilicon layer, using the side wall polymer as a mask to etch back the first polysilicon layer to form a crown shape structure, removing the side wall polymer, depositing a dielectric layer onto the first polysilicon layer, and depositing a second polysilicon layer onto the dielectric layer.

DESCRIPTION OF THE PREFERRED EMBODIMENT

The formation of the crown capacitor described herein includes the process of photolithographic masking and etching. This process consists of creating a photolithographic mask containing the pattern of the component to be formed, coating the wafer with a light sensitive material called a photoresist, exposing the photoresist coated wafer to ultraviolet light through the mask to soften or harden parts of the photoresist (depending on whether positive or negative photoresist is used), removing the softened parts of the photoresist, etching to remove the materials left unprotected by the photoresist and stripping the remaining photoresist. This photolithographic masking and etching process is referred to as "patterning and etching".

Figure 1:
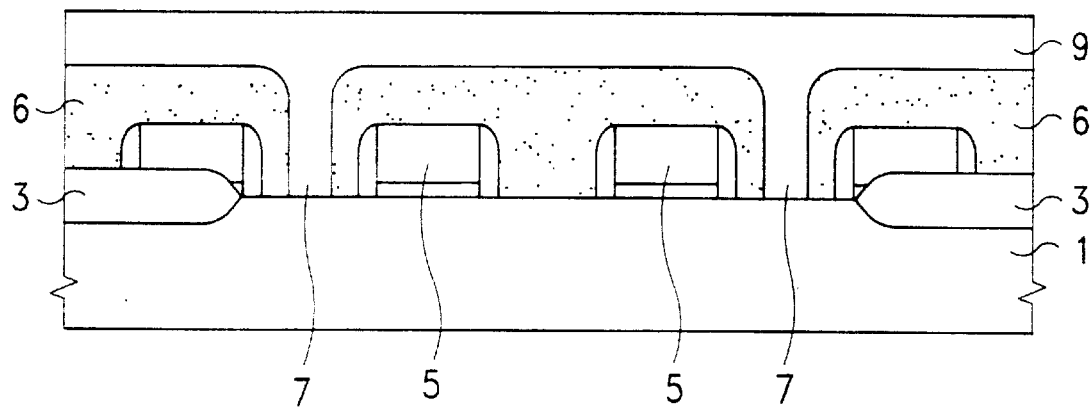
FIG. 1 is a cross section view of a semiconductor wafer illustrating the step of formating a first polysilicon layer on a semiconductor substrate.

Referring to FIG. 1, a silicon wafer 2 for holding DRAM cells is shown. The silicon wafer 2 includes a single crystal substrate 1, a field oxide 3, gate electrodes 5, contact windows 7, and a first polysilicon layer 9. In the preferred embodiment, the single crystal substrate 1 is P-type with a <100> crystallographic orientation.

The field oxide (FOX) 3 is created for purposes of isolating the adjacent structures. Generally, the FOX 3 region is created using well known photolithography and dry etching steps. In the preferred embodiment, first a silicon nitride-silicon dioxide composite layer is deposited onto the substrate 1. A photoresist is then applied to the composite layer that delineates the desired FOX 3 regions. After the photoresist is removed, the wafer 2 is wet cleaned. Next, thermal oxidation in an oxygen steam environment is used to form FOX 3. Preferably, FOX has a thickness of about 4000–6000 angstroms.

The gate electrodes 5 are the gates of access transistors formed in substrate 1. Source and drain impurity regions are formed between the gate electrodes 5 under the contact windows 7. The formation of the access transistors for DRAMs is well known in the art and is not particularly germane to the present invention. Thus, only a cursory description of the transistors is given here. One example is seen in U.S. Pat. No. 5,489,791 to Arnna et al.

As will be seen below, an isolation layer 6 is formed on the substrate 1 and gate electrodes 5 for isolation. Contact windows 7 in the isolation layer 6 are formed to allow the source and drain of the access transistors to be electrically connected to the capacitors of the present invention. The contact windows 7 are formed using a pattern and etch technique.

The first polysilicon layer 9 is formed over the isolation layer 6" 5, the contact windows 7, and the FOX 3. The first polysilicon layer 9 is formed using low pressure chemical vapor deposition (LPCVD). It can be appreciated that other methods of depositing the first polysilicon layer 9 can also be used. The thickness of the first polysilicon layer 9 is optimally between about 3000 to 7000 angstroms. The first polysilicon layer 9 is chosen from doped polysilicon or in-situ doped polysilicon.

Figure 2:
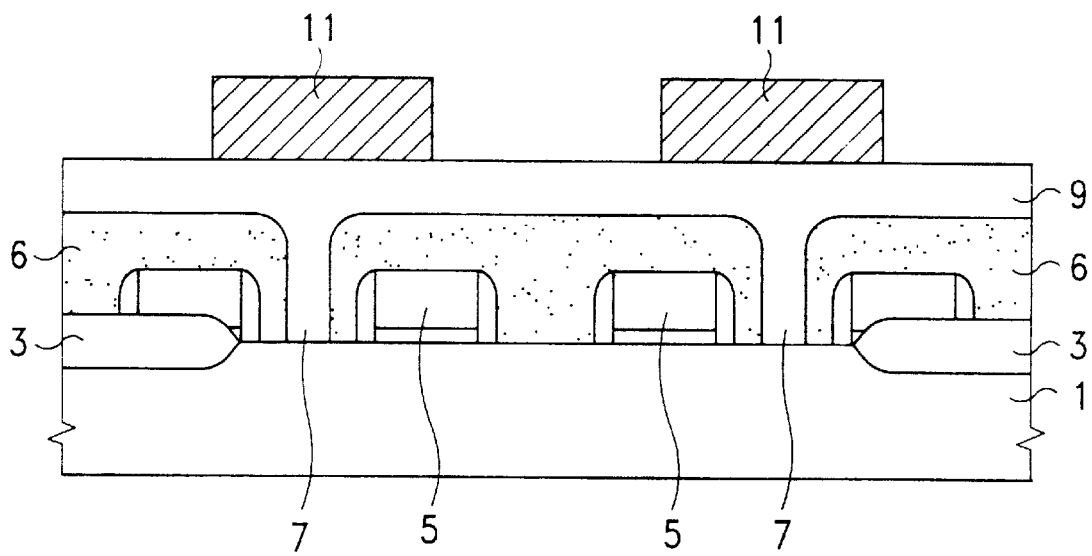
FIG. 2 is a cross section view of a semiconductor wafer illustrating the step of patterning a photoresist onto the first polysilicon layer.

Turning next to FIG. 2, a photoresist 11 is formed on the first polysilicon layer 9. The photoresist 11 is placed above the two distal contact windows 7 and also extending over the two gate electrodes 5, as shown in FIG. 2.

Figure 3:
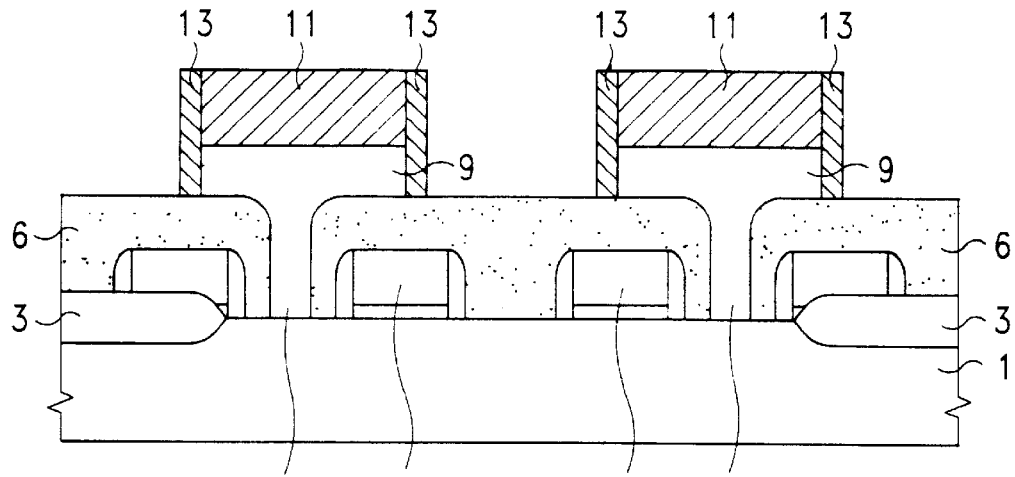
FIG. 3 is a cross section view of a semiconductor wafer illustrating the step of etching the first polysilicon layer.

Turning to FIG. 3, the first polysilicon layer 9 is etched, using plasma dry etching techniques to remove the unmasked first polysilicon layer 9.The etchant of the etching is a mixture of $Cl_2$ with HBr, a mixture of HBr with $SF_6$ or a mixture of $Cl_2$ with $O_2$. As a result of the etching process, polymers 13 are formed on the side wall of the the first polysilicon layer 9 and the photoresist 11. Specifically, it has been found that the combination of the etching gas, the photoresist 11, and the polysilicon react to form polymers 13.

Figure 4:
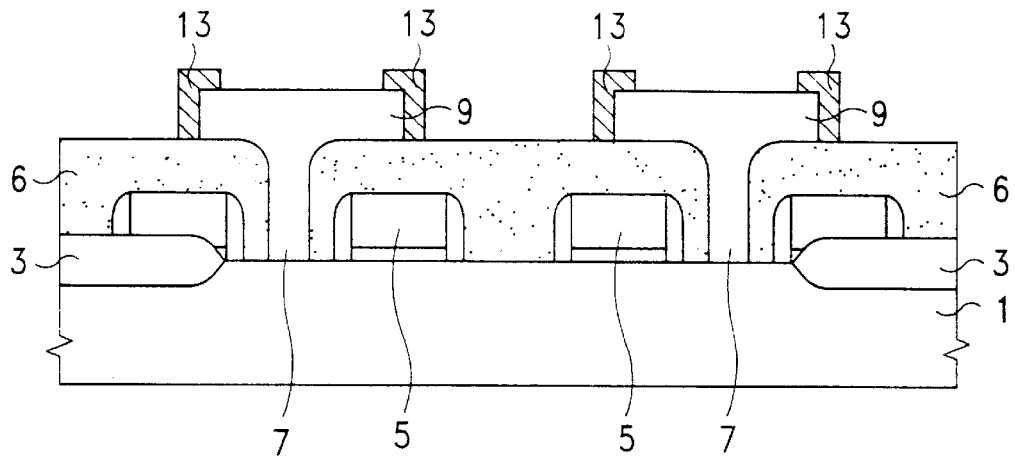
FIG. 4 is a cross section view of a semiconductor wafer illustrating the step of stripping the photoresist.

Next, as shown in FIG. 4, the photoresist 11 is stripped using a conventional oxygen plasma etching process. As a result of the plasma etching, polymers 13 are formed on the edges of the top surface of the first polysilicon layer 9.

Figure 5:
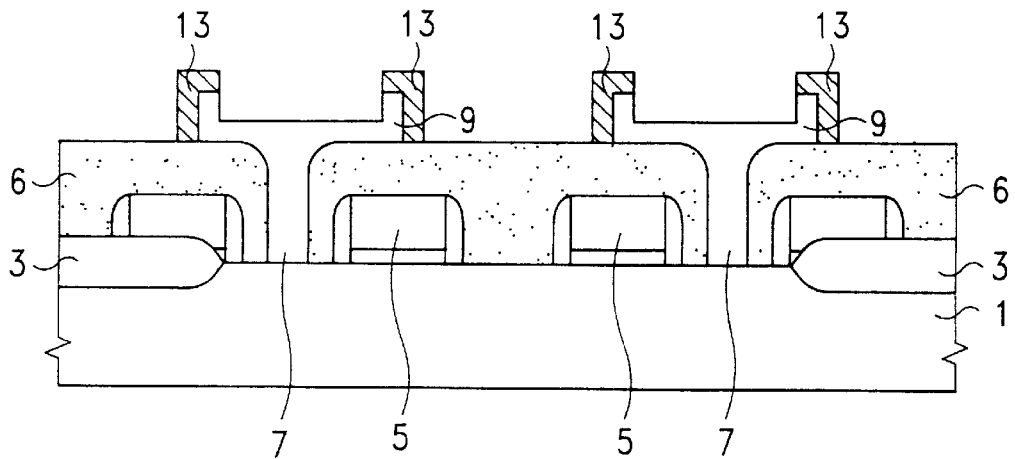
FIG. 5 is a cross section view of a semiconductor wafer illustrating the step of etching back the first polisilicon layer.

The next step in the process is to etch back the first polysilicon layer 9 to form a crown shape structure in first polysilicon layer 9 using polymer 13 as a mask. In the preferred embodiment, the etchant is a mixture of HBr with $SF_6$, a mixture of $Cl_2$ with HBr, or a mixture of $Cl_2$ with 2. FIG. 5 shows the resulting structure of the first polysilicon layer 9 after etching. The first polysilicon layer 9 serves as the bottom storage electrode of the capacitor.

Figure 6:
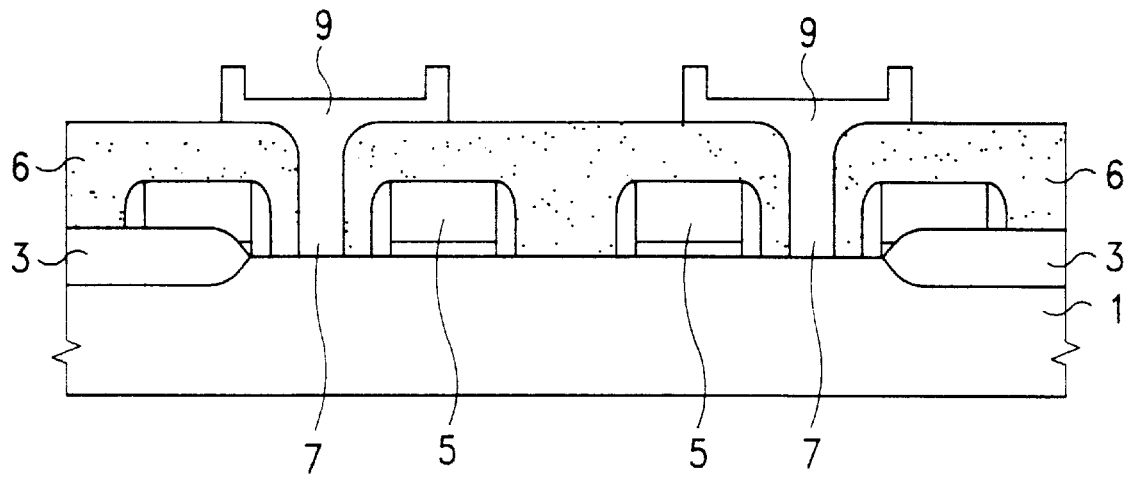
FIG. 6 is a cross section view of a semiconductor wafer illustrating the step of removing the side wall polymer.

Next, the polymer 13 is removed using a $H_2 SO_4$ wet etching process, resulting in the structure shown in FIG. 6.

Figure 7:
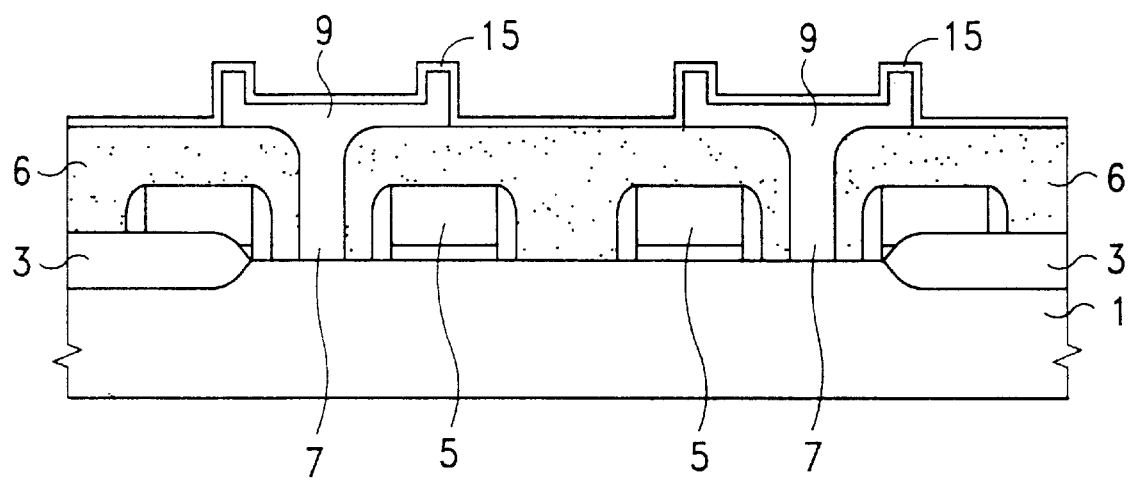
FIG. 7 is a cross section view of a semiconductor wafer illustrating the step of forming a dielectric layer on the first polysilicon layer.

Next, as shown in FIG. 7, a dielectric film 15 is formed using a conventional process along the surface of the first polysilicon layer 9. The dielectric film 15 is preferably formed from a double film of nitride/oxide film, a triple form of oxide/nitride/oxide, or any other high dielectric film such as tantalum oxide ($Ta_2 O_5$).

Figure 8:
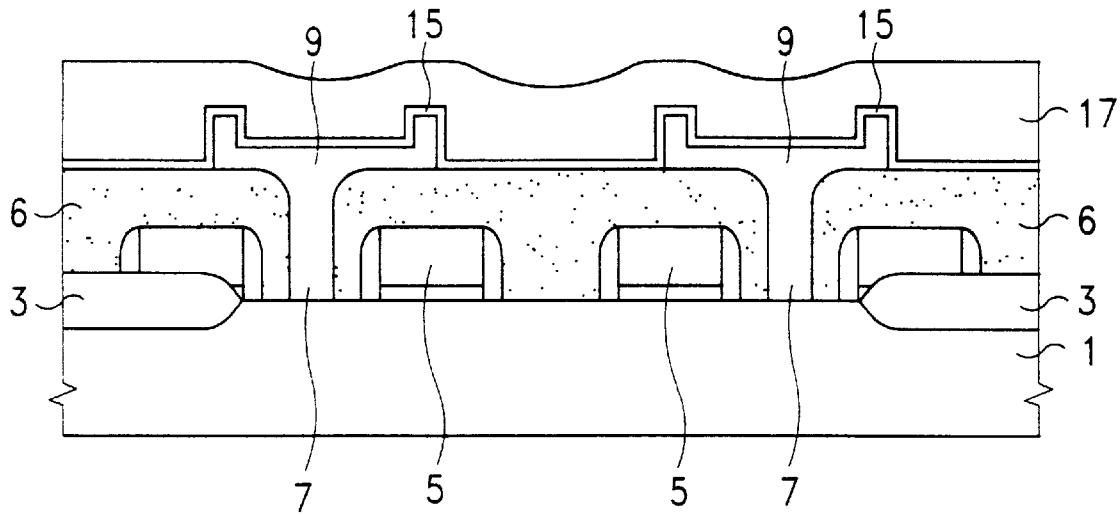
FIG. 8 is a cross section view of a semiconductor wafer illustrating the step of formating of a second polysilicon layer on the dielectric layer.
Figure 9:
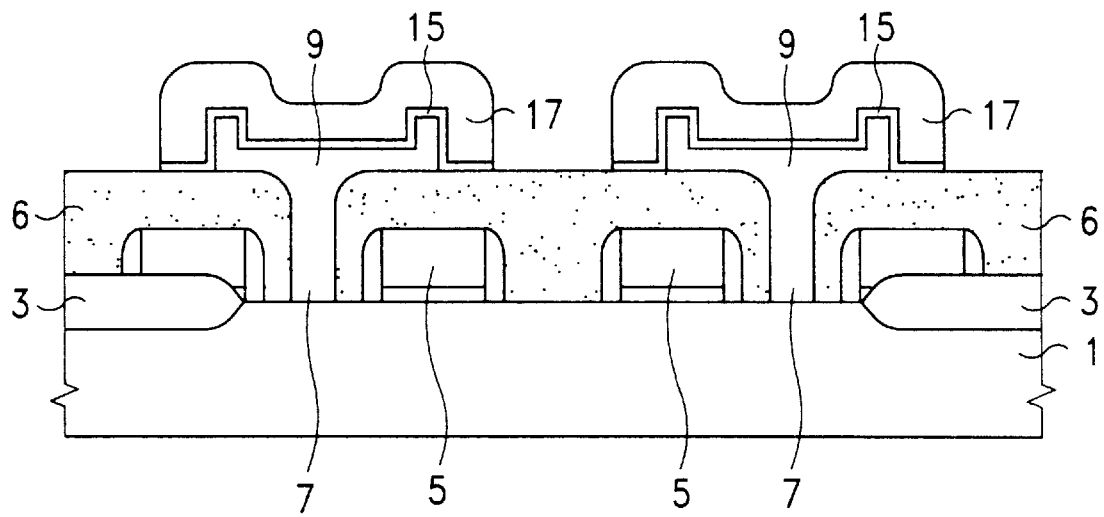
FIG. 9 is a cross section view of a semiconductor wafer illustrating the final structure of the prsent invention.

Finally, turning next to FIG. 8, a second polysilicon layer 17 is formed atop the entire structure of FIG. 7. Preferably, the second polysilicon layer 17 is formed of doped polysilicon or in-situ doped polysilicon. The resulting crown capacitor is formed from the first polysilicon layer 9, the dielectric film 15, and the second polysilicon layer 17, as shown in FIG. 9.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing an integrated circuit capacitor on a semiconductor substrate, comprising the steps of:

depositing a first conductive layer onto said semiconductor substrate;

forming a photoresist mask pattern on said first conductive layer;

etching said first conductive layer so as to form polymers along the sidewalls of the masked first conductive layer;

stripping said photoresist mask pattern;

etching back said first conductive layer using said polymers as a mask to form a crown shape structure;

removing said polymers;

forming a dielectric film on the surface of said first conductive layer; and forming a second conductive layer on said dielectric film.

2. The method of claim 1, further including the step of forming a field oxide layer selectively between said first conductive layer and said semiconductor substrate such that said first conductive layer contacts said substrate through predetermined contact windows in said field oxide layer.

3. The method of claim 2, wherein said first conductive layer is formed to have a thickness of a range between 3000 to 7000 angstroms.

4. The method of claim 1, wherein said first conductive layer and said second conductive layer are formed from doped polysilicon or in-situ doped polysilicon.

5. The method of claim 1, wherein said first conductive layer is etched by using plasma dry etching techniques, the etchant is a mixture of HBr with $SF_6$, a mixture of $Cl_2$ with HBr, or a mixture of $Cl_2$ with $O_2$.

6. The method of claim 1, wherein said photoresist is stripped by using oxygen plasma.

7. The method of claim 1, wherein said first conductive layer is etched back with a mixture of HBr with $SF_6$, a mixture of $Cl_2$ with HBr, or a mixture of $Cl_2$ with $O_2$.

8. A method of forming a crown shape capacitor comprising the steps of:

forming a polysilicon layer;

patterning a photoresist on said polysilicon layer;

plasma dry etching said polysilicon layer;

using oxygen plasma to strip said photoresist;

forming a side wall polymer onto the side walls of said polysilicon layer;

using said side wall polymer as a mask to etch back said polysilicon layer to form a crown shape structure;

removing said side wall polymer;

depositing a dielectric layer onto said polysilicon layer; and depositing a second polysilicon layer onto said dielectric layer.

9. The method of claim 8, wherein said crown shape structure is etched back using a mixture of HBr with $SF_6$, a mixture of $Cl_2$ with HBr, or a mixture of $Cl_2$ with $O_2$.

* * * * *

UNITED STATES PATENT AND TRADEMARK OFFICE
CERTIFICATE OF CORRECTION

PATENT NO. : 5,932,115
DATED : August 3, 1999
INVENTOR(S) : Y.-C. Ho et al.

It is certified that error appears in the above-identified patent and that said Letters Patent is hereby corrected as shown below:

Title page, item [56]

Refs. Cited    after "Baglee" insert --et al.--
  (U.S. Patents,
    Item 2)

Signed and Sealed this

Ninth Day of May, 2000

Attest:

Q. TODD DICKINSON

*Attesting Officer*      *Director of Patents and Trademarks*